(12) United States Patent
Hu

(10) Patent No.: US 12,027,462 B2
(45) Date of Patent: Jul. 2, 2024

(54) METHOD AND STRUCTURE FOR DETERMINING BLOCKING ABILITY OF COPPER DIFFUSION BLOCKING LAYER

(71) Applicant: Shenzhen China Star Optoelectronics Semiconductor Display Technology Co., Ltd., Guangdong (CN)

(72) Inventor: Xiaobo Hu, Guangdong (CN)

(73) Assignee: Shenzhen China Star Optoelectronics Semiconductor Display Technology Co., Ltd., Guangdong (CN)

( * ) Notice: Subject to any disclaimer, the term of this patent is extended or adjusted under 35 U.S.C. 154(b) by 1023 days.

(21) Appl. No.: 16/961,927

(22) PCT Filed: May 21, 2020

(86) PCT No.: PCT/CN2020/091630
§ 371 (c)(1),
(2) Date: Jul. 14, 2020

(87) PCT Pub. No.: WO2021/227123
PCT Pub. Date: Nov. 18, 2021

(65) Prior Publication Data
US 2023/0100023 A1    Mar. 30, 2023

(30) Foreign Application Priority Data

May 14, 2020 (CN) .......................... 202010408314.0

(51) Int. Cl.
*H01L 23/532* (2006.01)
*H01L 21/285* (2006.01)
(Continued)

(52) U.S. Cl.
CPC .. *H01L 23/53238* (2013.01); *H01L 21/28562* (2013.01); *H01L 21/76849* (2013.01); *H01L 21/76864* (2013.01); *H01L 23/15* (2013.01)

(58) Field of Classification Search
CPC ... H01L 22/12; H01L 22/14; H01L 23/53238; H01L 21/76864
See application file for complete search history.

(56) References Cited

U.S. PATENT DOCUMENTS 5,818,151 A * 10/1998 Takai ................... H10N 30/877
310/364
6,580,140 B1    6/2003 Ballantine et al.
(Continued)

FOREIGN PATENT DOCUMENTS

CN         101136356 A    3/2008
CN         102364673 A    2/2012
(Continued)

OTHER PUBLICATIONS

International Search Report in International application No. PCT/CN2020/091630, dated Feb. 18, 2021.
(Continued)

*Primary Examiner* — Anthony Ho
*Assistant Examiner* — David J Goodwin
(74) *Attorney, Agent, or Firm* — PV IP PC; Wei Te Chung; Zhigang Ma

(57) ABSTRACT

A method and a structure for determining a blocking ability of a copper diffusion blocking layer are disclosed. The method includes: a step S1 of forming an a-Si semiconductor layer, the copper diffusion blocking layer, and a copper electrode layer on a glass substrate; a step S2 of forming a transparent electrode layer on the glass substrate; a step S3 of performing a high temperature deterioration process to the glass substrate; and a step S4 of observing a degree of forming the black copper-silicon alloy layer on a surface of a composite film layer sample of the glass substrate.

15 Claims, 3 Drawing Sheets

(51) Int. Cl.
   *H01L 21/768*    (2006.01)
   *H01L 23/15*    (2006.01)

(56) References Cited

U.S. PATENT DOCUMENTS

| | | | |
|---|---|---|---|
| 6,607,927 B2* | 8/2003 | Ramappa | H01L 22/14 |
| | | | 257/E21.531 |
| 6,621,290 B1* | 9/2003 | Marathe | H01L 22/14 |
| | | | 257/E21.531 |
| 9,147,618 B2* | 9/2015 | Koschinsky | H01L 23/53295 |
| 9,472,477 B1* | 10/2016 | Bonilla | H01L 23/5226 |
| 2012/0178204 A1* | 7/2012 | Toor | H01L 31/0284 |
| | | | 257/E31.13 |
| 2013/0138415 A1* | 5/2013 | Gu | H01L 22/12 |
| | | | 702/179 |
| 2013/0206225 A1 | 8/2013 | Zinn et al. | |

FOREIGN PATENT DOCUMENTS

| | | |
|---|---|---|
| CN | 102768988 A | 11/2012 |
| CN | 103247601 A | 8/2013 |
| CN | 108598018 A | 9/2018 |
| CN | 110223968 A | 9/2019 |

OTHER PUBLICATIONS

Written Opinion of the International Search Authority in International application No. PCT/CN2020/091630, dated Feb. 18, 2021.
Chinese Office Action issued in corresponding Chinese Patent Application No. 202010408314.0 dated Feb. 15, 2023, pp. 1-9.

\* cited by examiner

METHOD AND STRUCTURE FOR DETERMINING BLOCKING ABILITY OF COPPER DIFFUSION BLOCKING LAYER

RELATED APPLICATIONS

This application is a National Phase of PCT Patent Application No. PCT/CN2020/091630 having International filing date of May 21, 2020, which claims the benefit of priority of Chinese Patent Application No. 202010408314.0 filed on May 14, 2020. The contents of the above applications are all incorporated by reference as if fully set forth herein in their entirety.

FIELD AND BACKGROUND OF THE INVENTION

The present disclosure relates to the technical field of manufacturing display devices, and in particular, to a method and a structure for determining a blocking ability of a copper diffusion blocking layer.

With continuous development of display technology of tablets, people require that a size, resolution, and a picture refreshing rate of a display device are gradually improved, thus employing copper to be a conductive metal material rather than aluminum. However, an adhesion force between a copper metal thin film and a substrate is poor, and a diffusion coefficient of copper atoms in copper metal is high. Therefore, a copper diffusion blocking layer is disposed between the copper metal thin film and the substrate, so that by using the copper diffusion blocking layer, the adhesion force of the copper metal thin film is increased, and the copper atoms may be blocked from diffusing toward the semiconductor substrate.

In conventional techniques, common material of the copper diffusion blocking layer is Mo, Ti, W, MoTi, and the like. Moreover, the copper diffusion blocking layer is a polycrystalline structure and has grain boundaries which are main channels for diffusing the copper atoms. Currently, common methods for evaluating the ability of the copper diffusion blocking layer made of various materials to block the diffusion of the copper atoms is that: the device is subjected to a high temperature deterioration process and a slicing process, and then a diffusion depth and distribution of the copper atoms are tested by a transmission electron microscope and secondary electron spectrum. However, efficiency of this method is low, and a cycle of this method is long.

SUMMARY OF THE INVENTION

Technical Problem

The present disclosure purposes a method for determining a blocking ability of a copper diffusion blocking layer, which determines a blocking characteristic of material of the copper diffusion blocking layer by observing a copper-silicon alloy layer formed in film layers.

The present disclosure purposes a structure for determining the blocking ability of the copper diffusion blocking layer, which determines the blocking characteristic of the material of the copper diffusion blocking layer by observing the copper-silicon alloy layer formed in the film layers.

Technical Solutions

Technical solutions provided by the present disclosure are as follows:

Embodiments of the present disclosure provide a method for determining a blocking ability of a copper diffusion blocking layer, and the method includes:

a step S1 of forming an a-Si semiconductor layer, the copper diffusion blocking layer, and a copper electrode layer on a glass substrate in sequence, followed by patterning the copper diffusion blocking layer and the copper electrode layer by performing a lithography process and an etching process;

a step S2 of forming a transparent electrode layer on the glass substrate;

a step S3 of performing a high temperature deterioration process to the glass substrate, wherein during the high temperature deterioration process, copper atoms in the copper electrode layer and silicon atoms in the a-Si semiconductor layer diffuse through the copper diffusion blocking layer to gradually form a copper-silicon alloy layer which is black;

a step S4 of observing a degree of forming the black copper-silicon alloy layer on a surface of a composite film layer sample of the glass substrate; and a step S5 of replacing material of the copper diffusion blocking layer in the step S1 and repeating the step S1 to the step S4, followed by observing variation of the surface color of the composite film layer samples including the copper diffusion blocking layers made of different materials, wherein if the surface color becomes black, an ability of the corresponding copper diffusion blocking material to block the diffusion of the copper atoms is determined to be poor;

wherein in the step S1, the a-Si semiconductor layer, the copper diffusion blocking layer, and the copper electrode layer are formed by chemical vapor deposition or physical vapor deposition; and in the step S1, the copper diffusion blocking layer is disposed between the a-Si semiconductor layer and the copper electrode layer.

According to the method for determining the blocking ability of the copper diffusion blocking layer provided by the embodiments of the present disclosure, in the step S2, the transparent electrode layer is made of indium tin oxide, indium zinc oxide or silicon dioxide.

According to the method for determining the blocking ability of the copper diffusion blocking layer provided by the embodiments of the present disclosure, the transparent electrode layer completely covers the a-Si semiconductor layer and the copper electrode layer.

According to the method for determining the blocking ability of the copper diffusion blocking layer provided by the embodiments of the present disclosure, in the step S2, the transparent electrode layer is formed by chemical vapor deposition or physical vapor deposition.

According to the method for determining the blocking ability of the copper diffusion blocking layer provided by the embodiments of the present disclosure, in the step S3, a temperature of the high temperature deterioration process is from 200° C. to 400° C., and a process time of the high temperature deterioration process is from 0.5 hr to 10 hr.

According to the method for determining the blocking ability of the copper diffusion blocking layer provided by the embodiments of the present disclosure, in the step S5, the material of the copper diffusion blocking layer includes Mo, Ti, MoTi, or MoNb.

According to the method for determining the blocking ability of the copper diffusion blocking layer provided by the embodiments of the present disclosure, in the step S5, the ability of the copper diffusion blocking layers made of the different materials to block the diffusion of the copper atoms is determined by determining the degree of blackening the surfaces of the composite film layer samples including the copper diffusion blocking layers made of the different materials.

The embodiments of the present disclosure provide a method for determining a blocking ability of a copper diffusion blocking layer, and the method includes:

- a step S1 of forming an a-Si semiconductor layer, the copper diffusion blocking layer, and a copper electrode layer on a glass substrate in sequence, followed by patterning the copper diffusion blocking layer and the copper electrode layer by performing a lithography process and an etching process;
- a step S2 of forming a transparent electrode layer on the glass substrate;
- a step S3 of performing a high temperature deterioration process to the glass substrate, wherein during the high temperature deterioration process, copper atoms in the copper electrode layer and silicon atoms in the a-Si semiconductor layer diffuse through the copper diffusion blocking layer to gradually form a copper-silicon alloy layer which is black;
- a step S4 of observing a degree of forming the black copper-silicon alloy layer on a surface of a composite film layer sample of the glass substrate; and
- a step S5 of replacing material of the copper diffusion blocking layer in the step S1 and repeating the step S1 to the step S4, followed by observing variation of the surface color of the composite film layer samples including the copper diffusion blocking layers made of different materials, wherein if the surface color becomes black, an ability of the corresponding copper diffusion blocking material to block the diffusion of the copper atoms is determined to be poor.

According to the method for determining the blocking ability of the copper diffusion blocking layer provided by the embodiments of the present disclosure, in the step S1, the a-Si semiconductor layer, the copper diffusion blocking layer, and the copper electrode layer are formed by chemical vapor deposition or physical vapor deposition.

According to the method for determining the blocking ability of the copper diffusion blocking layer provided by the embodiments of the present disclosure, in the step S1, the copper diffusion blocking layer is disposed between the a-Si semiconductor layer and the copper electrode layer.

According to the method for determining the blocking ability of the copper diffusion blocking layer provided by the embodiments of the present disclosure, in the step S2, the transparent electrode layer is made of indium tin oxide, indium zinc oxide or silicon dioxide.

According to the method for determining the blocking ability of the copper diffusion blocking layer provided by the embodiments of the present disclosure, the transparent electrode layer completely covers the a-Si semiconductor layer and the copper electrode layer.

According to the method for determining the blocking ability of the copper diffusion blocking layer provided by the embodiments of the present disclosure, in the step S2, the transparent electrode layer is formed by chemical vapor deposition or physical vapor deposition.

According to the method for determining the blocking ability of the copper diffusion blocking layer provided by the embodiments of the present disclosure, in the step S3, a temperature of the high temperature deterioration process is from 200° C. to 400° C., and a process time of the high temperature deterioration process is from 0.5 hr to 10 hr.

According to the method for determining the blocking ability of the copper diffusion blocking layer provided by the embodiments of the present disclosure, in the step S5, the material of the copper diffusion blocking layer includes Mo, Ti, MoTi, or MoNb.

According to the method for determining the blocking ability of the copper diffusion blocking layer provided by the embodiments of the present disclosure, in the step S5, the ability of the copper diffusion blocking layers made of the different materials to block the diffusion of the copper atoms is determined by determining the degree of blackening the surfaces of the composite film layer samples including the copper diffusion blocking layers made of the different materials.

The embodiments of the present disclosure provide a structure for determining a blocking ability of a copper diffusion blocking layer, and the structure includes:

- a glass substrate;
- a first copper-silicon alloy layer disposed on the glass substrate;
- a copper diffusion blocking layer disposed on the first copper-silicon alloy layer;
- a second copper-silicon alloy layer disposed on the copper diffusion blocking layer; and
- a transparent electrode layer disposed on the second copper-silicon alloy layer;
- wherein the first copper-silicon alloy layer is connected with the second copper-silicon alloy layer.

Advantageous Effects

The embodiments of the present disclosure provide a method and a structure for determining the blocking ability of the copper diffusion blocking layer. A device structure is formed by depositing the glass substrate, the a-Si semiconductor layer, the copper diffusion blocking layer, the copper electrode layer, and the transparent electrode layer from bottom to top in sequence. Then, the substrate is subjected to the high temperature deterioration process. During the high temperature deterioration process, the copper atoms in the copper electrode layer diffuse into the a-Si semiconductor layer through grain boundaries of the copper diffusion blocking layer, and the silicon atoms in the a-Si semiconductor layer diffuse into the copper electrode layer through the grain boundaries of the copper diffusion blocking layer, thus gradually forming the copper-silicon alloy layer which is black. The different materials of the copper diffusion blocking layer are replaced, the blocking characteristics of several materials of the copper diffusion blocking layer are evaluated by observing which material of the structural surface early becomes black, which is caused by the copper-silicon alloy layer, and observing the degree of blackening, and then the blocking characteristic of such a material is determined to be poor. In this way, the method may determine which material has the effective blocking characteristic to the copper atoms. The method for determining the blocking ability of the copper diffusion blocking layer provided by the embodiments may rapidly and effectively determine the blocking characteristics of various materials of the copper diffusion blocking layer, so that the appropriate material of the copper diffusion blocking layer may be chosen in accordance with the test results, and the deposition process of the copper diffusion blocking layer may further be optimized.

BRIEF DESCRIPTION OF THE SEVERAL VIEWS OF THE DRAWINGS

In order to clearly illustrate technical solutions in embodiments or in the prior art, the drawings required for using in the description of the embodiments or the prior art is briefly described below. Obviously, the drawings in the following description are only some of the embodiments of the present disclosure. For those skilled in the art, other drawings may also be obtained in accordance with these drawings without making for creative efforts.

DESCRIPTION OF SPECIFIC EMBODIMENTS OF THE INVENTION

Figure 1:
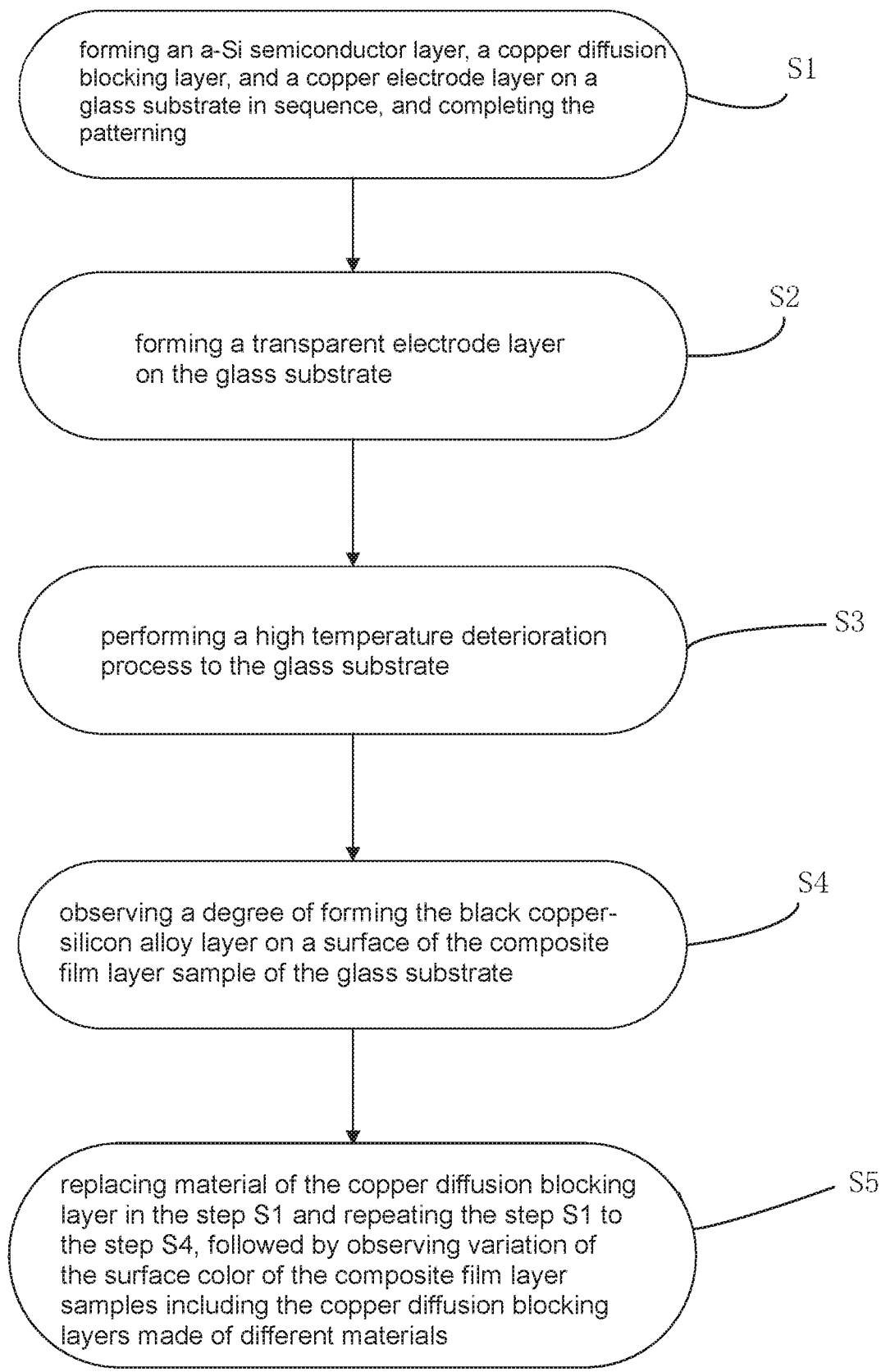
FIG. 1 is a schematic flow chart of a method for determining a blocking ability of a copper diffusion blocking layer.

In combination with accompanying drawings in embodiments of the present disclosure below, technical solutions in the embodiments of the present disclosure are clearly and completely described. Obviously, the described embodiments are merely a part of the embodiments of the present disclosure, rather than all the embodiments. Based on the embodiments in the present disclosure, all of other embodiments obtained by those skilled in the art without making for creative efforts belong to the scope protected by the present disclosure.

In the description of the present disclosure, it should be understood that indicative directions or position relations, such as terms "center", "longitudinal", "transverse", "length", "width", "thickness", "upper", "lower", "front", "back", "left", "right", "vertical", "horizontal", "top", "bottom", "inner", "outer", "clockwise", and "counterclockwise", are based on directions or position relations indicated by the accompanying drawings. The indicative directions or position relations are only for convenience of describing the present disclosure and simplifying the description, and do not indicate or imply that indicated devices or elements must have a specific orientation and be constructed and operated in a specific orientation. Therefore, the indicative directions or position relations cannot be understood to be limitation to the present disclosure. In addition, terms, such as "first" and "second", are only used for purposes of description, and do not be understood to indicate or imply relative importance or to imply numbers of indicated technical features. Thus, the features defined with "first" and "second" may explicitly or implicitly include one or more of the features. In the description of the present disclosure, term "a plurality of" means two or more than two, unless specified otherwise.

In the description of the present disclosure, it should be noted that unless specified or limited otherwise, terms "mounted", "linked", and "connected" are understood broadly, and may be, for example, fixed connection, detachable connection or integral connection; may be mechanical connection or electrical connection or may communicate with each other; may be direct connection or indirect connection via intermediate media; may be inner communication of two elements or interaction between two elements. For those of ordinary skill in the art, the specific meaning of the above-mentioned terms may be understood according to specific situations.

In the present disclosure, unless specified or limited otherwise, a structure in which a first feature is "on" or "below" a second feature may include direct contact between the first feature and the second feature, and may also include indirect contact between the first feature and the second feature via additional features formed therebetween. Moreover, a structure in which the first feature "on", "above", or "on top of" the second feature may include a structure in which the first feature is directly or obliquely above the second feature, or merely means that a height of the first feature is higher than a height of the second feature, and a structure in which the first feature "below," "under," or "on bottom of" the second feature may include a structure in which the first feature is directly or obliquely under the second feature, or merely means that a height of the first feature is lower than a height of the second feature.

Various embodiments and examples are provided in the following disclosure to realize different structures of the present disclosure. In order to simplify the present disclosure, components and settings of the particular examples are described below. However, these components and settings are only by way of example, and are not intended to limit the present disclosure. In addition, reference numerals and/or reference letters may be repeated in different examples in the present disclosure. This repeating is for the purposes of simplification and clarity, and does not refer to relations between various embodiments and/or settings. Furthermore, examples of various particular processes and materials are provided in the present disclosure, but those of ordinary skill in the art may appreciate applications of other processes and/or use of other materials.

As shown in FIG. 1 which is a schematic flow chart of a method for determining a blocking ability of a copper diffusion blocking layer provided by the embodiments, and the method includes following steps:

a step S1 of forming an a-Si semiconductor layer, the copper diffusion blocking layer, and a copper electrode layer on a glass substrate in sequence, followed by patterning the copper diffusion blocking layer and the copper electrode layer by performing a lithography process and an etching process.

Specifically, in the step S1, the a-Si semiconductor layer, the copper diffusion blocking layer, and the copper electrode layer are formed by chemical vapor deposition or physical vapor deposition. The copper diffusion blocking layer is disposed between the a-Si semiconductor layer and the copper electrode layer.

a step S2 of forming a transparent electrode layer on the glass substrate.

Specifically, in the step S2, the transparent electrode layer serves as a protection layer for the copper electrode layer to prevent oxidation of the copper electrode layer. Material of the transparent electrode is indium tin oxide, indium zinc oxide, or silicon dioxide, and completely covers the a-Si semiconductor layer and the copper electrode layer. The transparent electrode layer is manufactured by chemical vapor deposition or physical vapor deposition.

a step S3 of performing a high temperature deterioration process to the glass substrate, wherein during the high temperature deterioration process, copper atoms in the copper electrode layer and silicon atoms in the a-Si semiconductor layer diffuse through the copper diffusion blocking layer to gradually form a copper-silicon alloy layer which is black.

Specifically, in the step S3, during the high temperature deterioration process, the copper atoms in the copper electrode layer diffuse into the a-Si semiconductor layer through grain boundaries of the copper diffusion blocking layer, and the silicon atoms in the a-Si semiconductor layer diffuse into the copper electrode layer through the grain boundaries of the copper diffusion blocking layer, thus gradually forming the copper-silicon alloy layer. A temperature of the high temperature deterioration process is from 200° C. to 400° C., and a process time of the high temperature deterioration process is from 0.5 hr to 10 hr.

a step S4 of observing a degree of forming the black copper-silicon alloy layer on a surface of a composite film layer sample of the glass substrate.

a step S5 of replacing material of the copper diffusion blocking layer in the step S1 and repeating the step S1 to the step S4, followed by observing variation of the surface color of the composite film layer samples including the copper diffusion blocking layers made of different materials, wherein if the surface color becomes black, an ability of the corresponding copper diffusion blocking material to block the diffusion of the copper atoms is determined to be poor.

Specifically, in the step S5, the material of the copper diffusion blocking layer is Mo, Ti, MoTi, MoNb, or other Mo alloys. Moreover, in the step S5, the ability of the copper diffusion blocking layers made of the different materials to block the diffusion of the copper atoms is determined by determining the degree of blackening the surfaces of the composite film layer samples including the copper diffusion blocking layers made of the different materials.

Specifically, the embodiment takes the copper diffusion blocking layer made of Mo or MoTi as an example to specifically illustrate.

Figure 2:
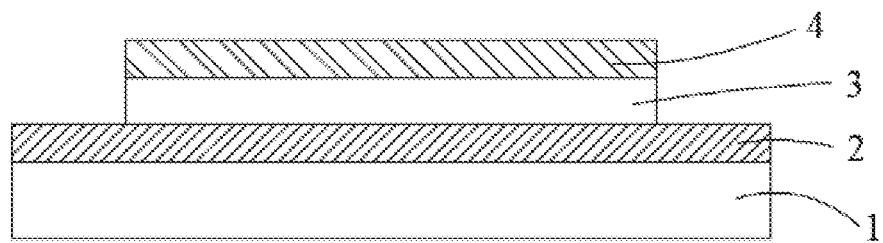
FIG. 2 is a schematic view of a step of the method for determining the blocking ability of the copper diffusion blocking layer.

As shown in FIG. 2, an a-Si semiconductor layer 2 is deposited on the glass substrate 1, and then a copper diffusion blocking layer 3 and a copper electrode layer 4 are deposited on the a-Si semiconductor layer 2. Next, a pattern is formed by performing a lithography process and an etching process. The material of the copper diffusion blocking layer 3 is Mo metal material.

Figure 3:
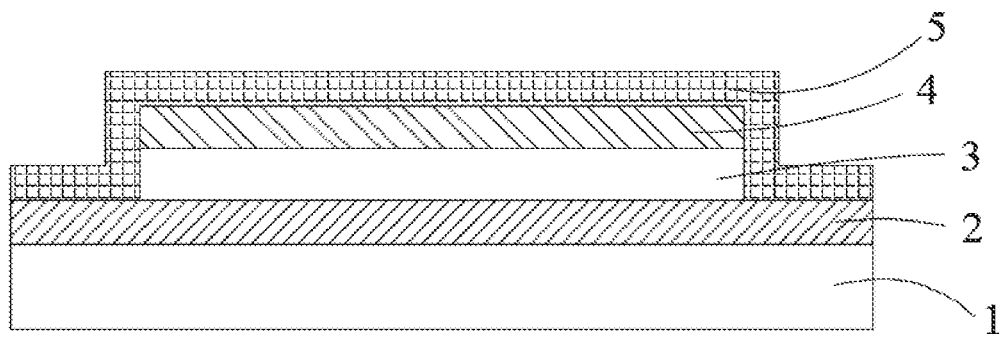
FIG. 3 is a schematic view of a step of the method for determining the blocking ability of the copper diffusion blocking layer.

As shown FIG. 3, a transparent electrode layer 5 is deposited on the glass substrate 1. The transparent electrode layer 5 serves as the protection layer to prevent the oxidation of the copper electrode layer 4. The material of the transparent electrode 5 is indium tin oxide, indium zinc oxide, or silicon dioxide, and completely covers the a-Si semiconductor layer 2 and the copper electrode layer 4. The transparent electrode layer 5 is manufactured by chemical vapor deposition or physical vapor deposition.

Figure 4:
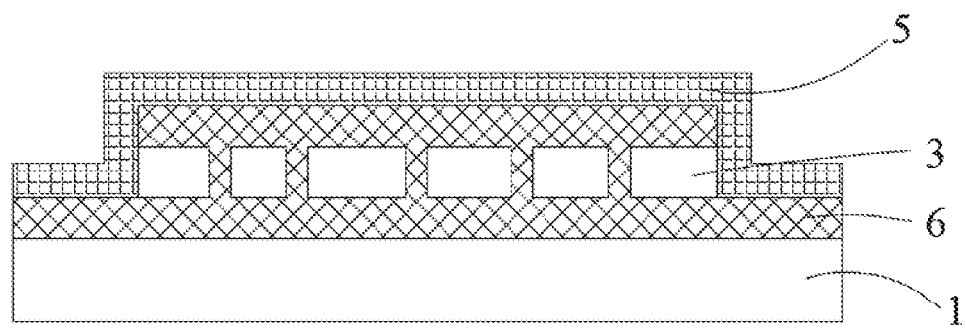
FIG. 4 is a schematic view of a step of the method for determining the blocking ability of the copper diffusion blocking layer.

As shown FIG. 4, the glass substrate 1 placed in an oven is subjected to the high temperature deterioration process. The temperature of the high temperature deterioration process is 300° C., and the process time of the high temperature deterioration process is 5 hr. During the high temperature deterioration process, the copper atoms in the copper electrode layer 4 diffuse into the a-Si semiconductor layer 2 through the grain boundaries of the copper diffusion blocking layer 3, and the silicon atoms in the a-Si semiconductor layer 2 diffuse into the copper electrode layer 4 through the grain boundaries of the copper diffusion blocking layer 3, thus gradually forming the copper-silicon alloy layer 6. Since the copper-silicon alloy layer 6 is black, the color variation presented on the surface of the film layer structure may be easily observed.

The material of the copper diffusion blocking layer 3 is replaced with MoTi material, and the above-mentioned steps are repeated to determine the ability of the copper diffusion blocking layer made of the MoTi material to block the copper atoms. After the same high temperature deterioration process is performed, in which the temperature is 300° C., and the process time is 5 hr, the film layer sample made of the Mo metal material is compared to the film layer sample made of the MoTi material, the surface of the film layer structure including the copper diffusion blocking layer 3 made of the Mo metal material does not present significant variation, and the surface of the film layer structure including the copper diffusion blocking layer 3 made of the MoTi material significantly becomes black. Thus, the blocking characteristic of the MoTi material to the copper atoms of may be determined to be more effective than the blocking characteristic of the Mo metal material to the copper atoms.

Therefore, by performing the same steps and replacing the different material of the copper diffusion blocking layer, the blocking characteristics of Mo, Ti, MoTi, MoNb, or other Mo alloys to the copper atoms may be tested, and the desirable material of the copper diffusion blocking layer may be chosen in accordance with the test results. The material of the copper diffusion blocking layer which may adapt to be tested by the method for determining the blocking ability of the copper diffusion blocking layer provided by the embodiments is not limited to Mo, Ti, MoTi, MoNb, or other Mo alloys provided in the embodiments. The method for determining the blocking ability of the copper diffusion blocking layer provided by the embodiments may also be employed to determine other materials which may be used for the copper diffusion blocking layer. Other materials used as the copper diffusion blocking layer, which are determined by the method for determining the blocking ability of the copper diffusion blocking layer, are also within a range of the technical solutions.

Figure 5:
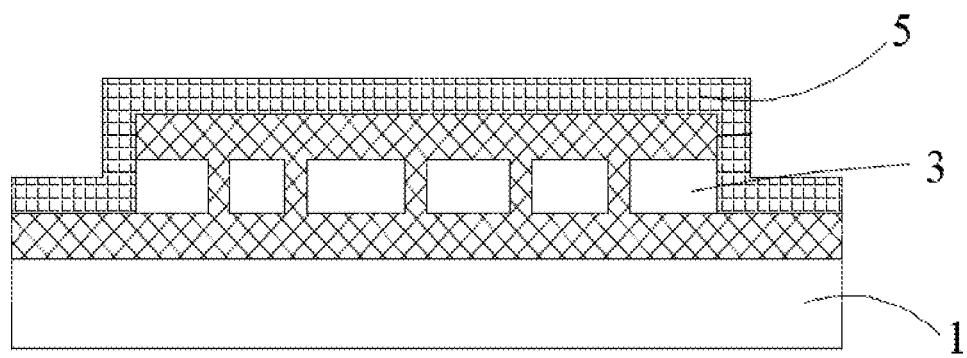
FIG. 5 is a schematic view of a structure for determining a blocking ability of a copper diffusion blocking layer.
Figure 6:
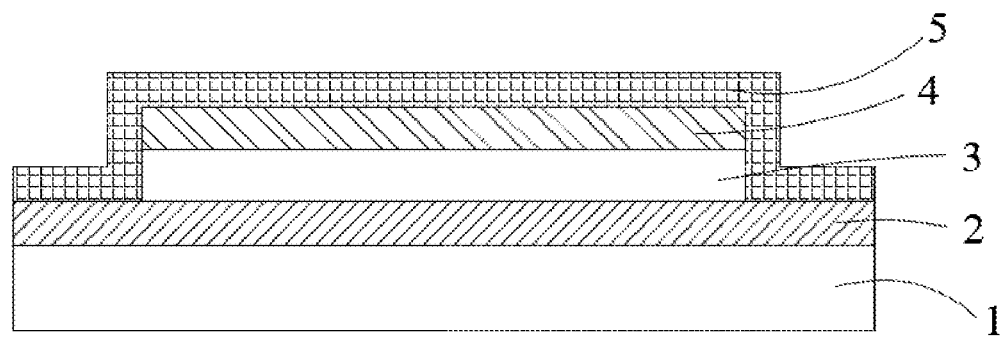
FIG. 6 is a structural schematic view of a glass substrate with a composite film layer.

As shown in FIG. 5 and FIG. 6, the embodiments further provide a structure for determining the blocking ability of the copper diffusion blocking layer. The structure includes: a glass substrate; a first copper-silicon alloy layer disposed on the glass substrate; a copper diffusion blocking layer disposed on the first copper-silicon alloy layer; a second copper-silicon alloy layer disposed on the copper diffusion blocking layer; and a transparent electrode layer disposed on the second copper-silicon alloy layer; wherein the first copper-silicon alloy layer is connected with the second copper-silicon alloy layer.

Specifically, the structure for determining the blocking ability of the copper diffusion blocking layer is formed by performing the high temperature deterioration process to the glass substrate provided with a composite film layer. The glass substrate provided with the composite film layer includes the glass substrate, the copper diffusion blocking layer, the copper electrode layer, and the transparent electrode layer. During the high temperature deterioration process, the copper atoms in the copper electrode layer 4 diffuse into the a-Si semiconductor layer 2 through the grain boundaries of the copper diffusion blocking layer 3, and the silicon atoms in the a-Si semiconductor layer 2 diffuse into the copper electrode layer 4 through the grain boundaries of the copper diffusion blocking layer 3, thus gradually forming the first copper-silicon alloy layer in the a-Si semiconductor layer and the second copper-silicon alloy layer in the copper electrode layer. Moreover, the first copper-silicon alloy layer and the second copper-silicon alloy layer are black. Therefore, the ability of the copper diffusion blocking layer to block the diffusion of the copper atoms is determined by determining the degree of forming the first copper-silicon alloy layer and the second copper-silicon alloy layer in the structure for determining the blocking ability of the copper diffusion blocking layer.

The embodiments of the present disclosure provide a method and a structure for determining the blocking ability of the copper diffusion blocking layer. A device structure is formed by depositing the glass substrate, the a-Si semiconductor layer, the copper diffusion blocking layer, the copper electrode layer, and the transparent electrode layer from bottom to top in sequence. Then, the substrate is subjected to the high temperature deterioration process. During the high temperature deterioration process, the copper atoms in the copper electrode layer diffuse into the a-Si semiconductor layer through the grain boundaries of the copper diffusion blocking layer, and the silicon atoms in the a-Si semiconductor layer diffuse into the copper electrode layer through the grain boundaries of the copper diffusion blocking layer, thus gradually forming the copper-silicon alloy layer which is black. The different materials of the copper diffusion blocking layer are replaced, the blocking characteristics of several materials of the copper diffusion blocking layer are evaluated by observing which material of the structural surface early becomes black, which is caused by the copper-silicon alloy layer, and observing the degree of blackening, and then the blocking characteristic of such a material is determined to be poor. In this way, the method may determine which material has the effective blocking characteristic to the copper atoms. The method for determining the blocking ability of the copper diffusion blocking layer provided by the embodiments may rapidly and effectively determine the blocking characteristics of various materials of the copper diffusion blocking layer, so that the appropriate material of the copper diffusion blocking layer may be chosen in accordance with the test results, and the deposition process of the copper diffusion blocking layer may further be optimized.

A method for determining the blocking ability of the copper diffusion blocking layer provided by the embodiments of the present disclosure are introduced in detail above. Specific examples herein are used to explain the principles and the implementation of the present disclosure. The illustration of the foregoing embodiments is only used to facilitate understanding the technical solutions and the core ideas of the present disclosure. Those skilled in the art should understand that: the technical solutions described in the foregoing embodiments can still be modified, or some of the technical features can be equivalently replaced, and these modifications or replacements do not make the essence of the corresponding technical solutions depart from the scope of the technical solutions of various embodiments of the present disclosure.

What is claimed is:

1. A method for determining a blocking ability of a copper diffusion blocking layer, comprising:
    a step S1 of forming an a-Si semiconductor layer, the copper diffusion blocking layer, and a copper electrode layer on a glass substrate in sequence, followed by patterning the copper diffusion blocking layer and the copper electrode layer by performing a lithography process and an etching process, wherein in the step S1, the a-Si semiconductor layer, the copper diffusion blocking layer, and the copper electrode layer are formed by chemical vapor deposition or physical vapor deposition; and in the step S1, the copper diffusion blocking layer is disposed between the a-Si semiconductor layer and the copper electrode layer, and material of the copper diffusion blocking layer is one selected from a group of Mo, Ti, MoTi, and MoNb;
    a step S2 of forming a transparent electrode layer on the glass substrate;
    a step S3 of performing a high temperature deterioration process to the glass substrate, wherein during the high temperature deterioration process, copper atoms in the copper electrode layer and silicon atoms in the a-Si semiconductor layer diffuse through the copper diffusion blocking layer to gradually form a copper-silicon alloy layer which is black;
    a step S4 of observing a degree of forming the black copper-silicon alloy layer on a surface of a composite film layer sample of the glass substrate; and
    a step S5 of replacing the material of the copper diffusion blocking layer in the step S1 with another selected from the group of Mo, Ti, MoTi, and MoNb and repeating the step S1 to the step S4, followed by observing variation of the surface color of composite film layer samples comprising the copper diffusion blocking layers made of different materials, wherein if the surface color becomes black, an ability of the corresponding copper diffusion material to block the diffusion of the copper atoms is determined to be poor.

2. The method for determining the blocking ability of the copper diffusion blocking layer according to claim 1, wherein in the step S2, the transparent electrode layer is made of indium tin oxide or indium zinc oxide.

3. The method for determining the blocking ability of the copper diffusion blocking layer according to claim 2, wherein the transparent electrode layer completely covers the a-Si semiconductor layer and the copper electrode layer.

4. The method for determining the blocking ability of the copper diffusion blocking layer according to claim 2, wherein in the step S2, the transparent electrode layer is formed by chemical vapor deposition or physical vapor deposition.

5. The method for determining the blocking ability of the copper diffusion blocking layer according to claim 1, wherein in the step S3, a temperature of the high temperature deterioration process is from 200° C. to 400° C., and a process time of the high temperature deterioration process is from 0.5 hr to 10 hr.

6. The method for determining the blocking ability of the copper diffusion blocking layer according to claim 1, wherein in the step S5, the ability of the copper diffusion blocking layers made of different materials to block the diffusion of the copper atoms is determined by determining the degree of blackening the surfaces of the composite film layer samples comprising the copper diffusion blocking layers made of the different materials.

7. A method for determining a blocking ability of a copper diffusion blocking layer, comprising:
    a step S1 of forming an a-Si semiconductor layer, the copper diffusion blocking layer, and a copper electrode layer on a glass substrate in sequence, followed by patterning the copper diffusion blocking layer and the copper electrode layer by performing a lithography process and an etching process, wherein material of the copper diffusion blocking layer is one selected from a group of Mo, Ti, MoTi, and MoNb;
    a step S2 of forming a transparent electrode layer on the glass substrate;
    a step S3 of performing a high temperature deterioration process to the glass substrate, wherein during the high temperature deterioration process, copper atoms in the copper electrode layer and silicon atoms in the a-Si semiconductor layer diffuse through the copper diffusion blocking layer to gradually form a copper-silicon alloy layer which is black;

a step S4 of observing a degree of forming the black copper-silicon alloy layer on a surface of a composite film layer sample of the glass substrate; and a step S5 of replacing the material of the copper diffusion blocking layer in the step S1 with another selected from the group of Mo, Ti, MoTi, and MoNb and repeating the step S1 to the step S4, followed by observing variation of the surface color of composite film layer samples comprising the copper diffusion blocking layers made of different materials, wherein if the surface color becomes black, an ability of the corresponding copper diffusion material to block the diffusion of the copper atoms is determined to be poor.

8. The method for determining the blocking ability of the copper diffusion blocking layer according to claim 7, wherein in the step S1, the a-Si semiconductor layer, the copper diffusion blocking layer, and the copper electrode layer are formed by chemical vapor deposition or physical vapor deposition.

9. The method for determining the blocking ability of the copper diffusion blocking layer according to claim 7, wherein in the step S1, the copper diffusion blocking layer is disposed between the a-Si semiconductor layer and the copper electrode layer.

10. The method for determining the blocking ability of the copper diffusion blocking layer according to claim 7, wherein in the step S2, the transparent electrode layer is made of indium tin oxide or indium zinc oxide.

11. The method for determining the blocking ability of the copper diffusion blocking layer according to claim 10, wherein the transparent electrode layer completely covers the a-Si semiconductor layer and the copper electrode layer.

12. The method for determining the blocking ability of the copper diffusion blocking layer according to claim 10, wherein in the step S2, the transparent electrode layer is formed by chemical vapor deposition or physical vapor deposition.

13. The method for determining the blocking ability of the copper diffusion blocking layer according to claim 7, wherein in the step S3, a temperature of the high temperature deterioration process is from 200° C. to 400° C., and a process time of the high temperature deterioration process is from 0.5 hr to 10 hr.

14. The method for determining the blocking ability of the copper diffusion blocking layer according to claim 7, wherein in the step S5, the ability of the copper diffusion blocking layers made of different materials to block the diffusion of the copper atoms is determined by determining the degree of blackening the surfaces of the composite film layer samples comprising the copper diffusion blocking layers made of the different materials.

15. A structure for determining a blocking ability of a copper diffusion blocking layer, comprising:

a glass substrate;

a first copper-silicon alloy layer disposed on the glass substrate;

a copper diffusion blocking layer disposed on the first copper-silicon alloy layer;

a second copper-silicon alloy layer disposed on the copper diffusion blocking layer; and a transparent electrode layer disposed on the second copper-silicon alloy layer.

* * * * *